United States Patent [19]

Zimmermann

[11] Patent Number: 5,086,268
[45] Date of Patent: Feb. 4, 1992

[54] MEASURING MOUNT FOR MICROWAVE COMPONENTS

[75] Inventor: Walter Zimmermann, Dorfen, Fed. Rep. of Germany

[73] Assignee: Siemens Aktiengesellschaft, Munich, Fed. Rep. of Germany

[21] Appl. No.: 490,409

[22] Filed: Mar. 8, 1990

[30] Foreign Application Priority Data

Mar. 20, 1989 [EP] European Pat. Off. ............ 89104951

[51] Int. Cl.⁵ .......................... G01R 1/00; G01R 1/02
[52] U.S. Cl. .................. 324/158 F; 324/72.5; 324/158 P; 333/260
[58] Field of Search ............... 324/158 F, 158 P, 72.5; 333/246, 260

[56] References Cited

U.S. PATENT DOCUMENTS

| | | |
|---|---|---|
| 4,340,860 | 7/1982 | Teeple, Jr. |
| 4,365,195 | 12/1982 | Stegens ............................ 324/158 F |
| 4,367,584 | 1/1983 | Janisiewicz et al. ............ 324/158 F |
| 4,478,352 | 10/1984 | Amundson et al. ............. 324/158 F |
| 4,535,307 | 8/1985 | Tsukii ............................... 324/158 F |
| 4,689,556 | 8/1987 | Cedrone ........................... 324/158 F |
| 4,707,656 | 11/1987 | Marzan . |
| 4,747,784 | 5/1988 | Cedrone ........................... 324/158 F |
| 4,835,464 | 5/1989 | Slye et al. ........................ 324/158 F |
| 4,836,797 | 6/1989 | Riechelmann ................... 324/158 F |

FOREIGN PATENT DOCUMENTS

8810268.8  12/1988  Fed. Rep. of Germany .

OTHER PUBLICATIONS

Publication "A Coaxial Test Fixture For Microwave Transistor Characterisation" by J. J. M. Kwaspen published at the Eindhoven University of Technology, Department of Electrical 9/85 Engineering, P.O. Box 513, 5600MB Eindhoven, The Netherlands.

*Primary Examiner*—Kenneth A. Wieder
*Assistant Examiner*—William J. Burns
*Attorney, Agent, or Firm*—Hill, Van Santen, Steadman & Simpson

[57] ABSTRACT

A measuring mount for microwave components provides very high precision measuring of microwave components that include automatic units. The measuring mount has a slide for introducing the component 30 being measured into the measuring mount and for positioning and contacting the component 30 which is to be measured in the measuring mount. The slide provides that good electrical contact will be made with the component so as to assure that the measured characteristics will be accurate.

3 Claims, 5 Drawing Sheets

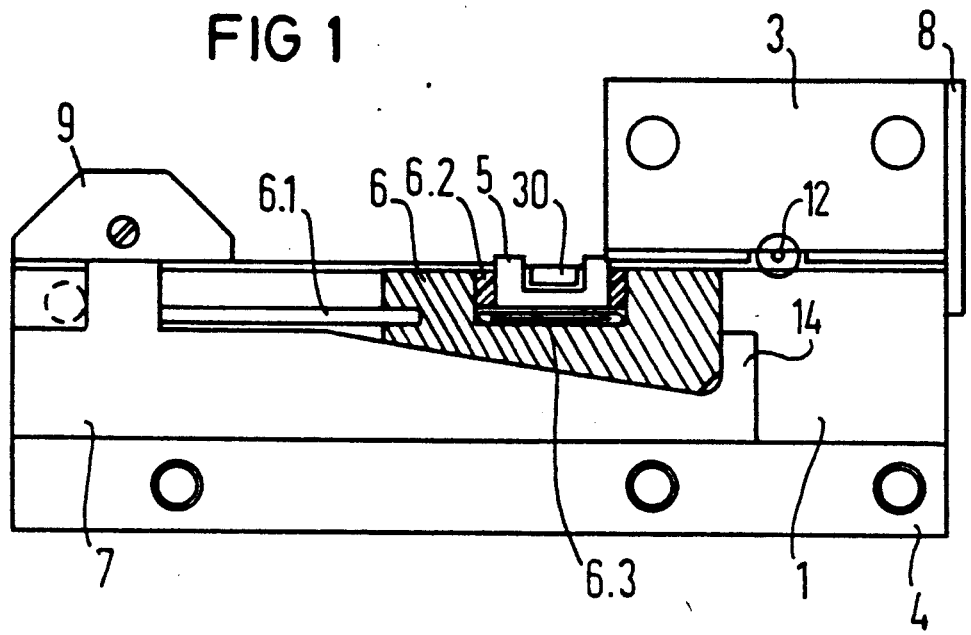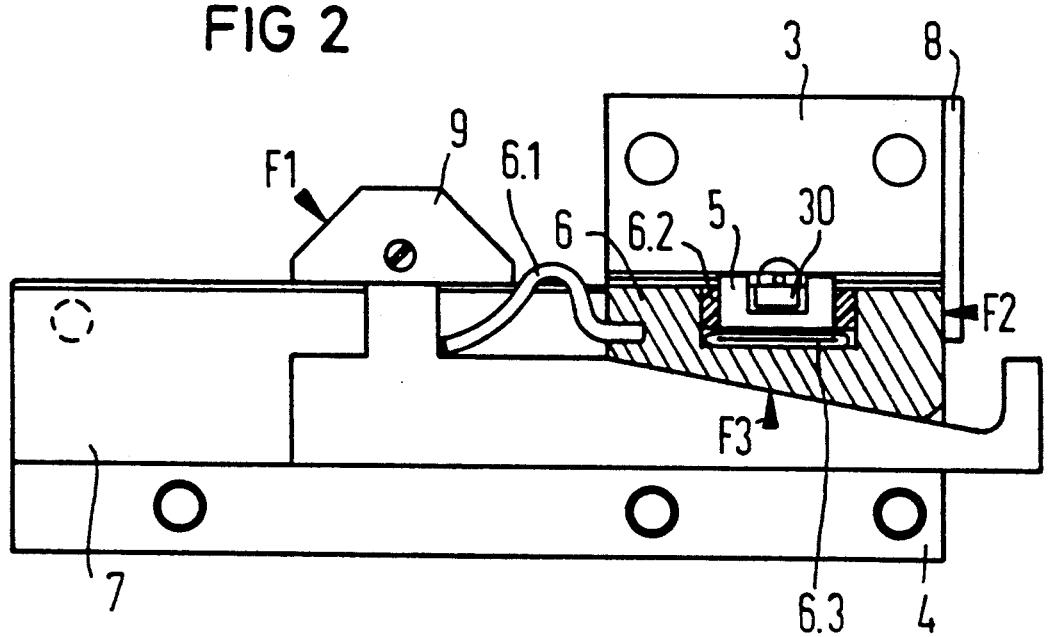

FIG 12 FIG 13
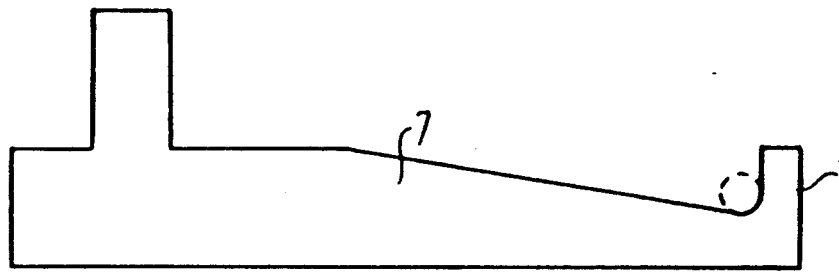
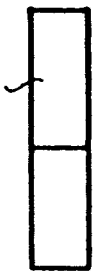
FIG 14
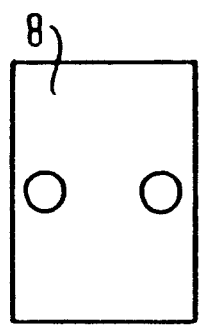

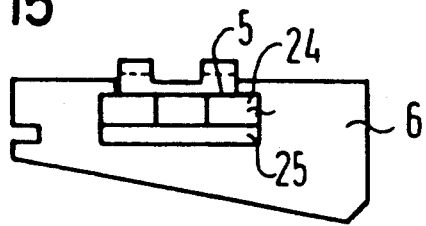
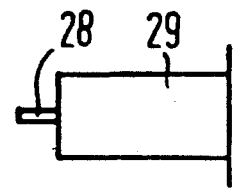
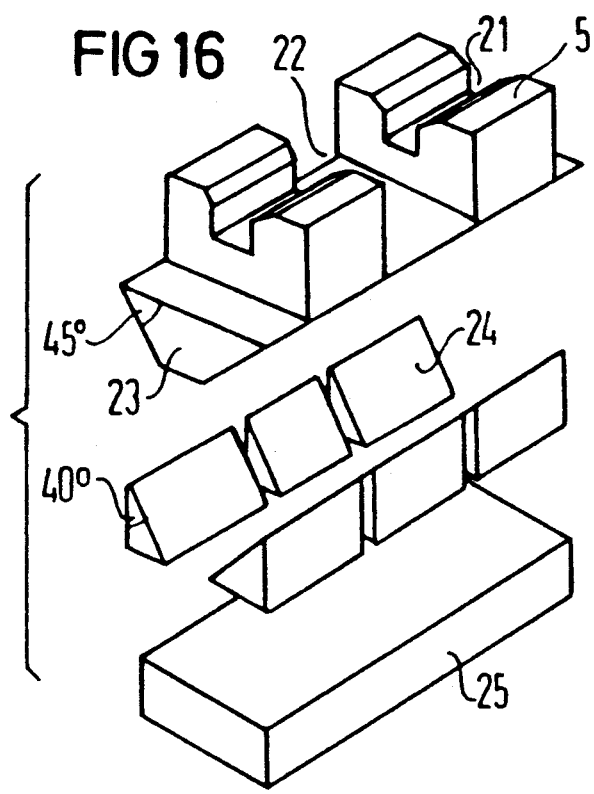
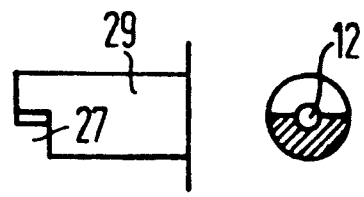
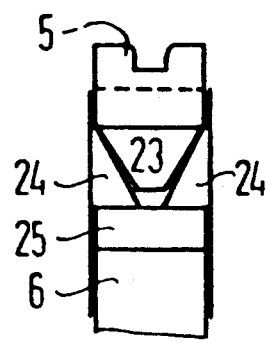
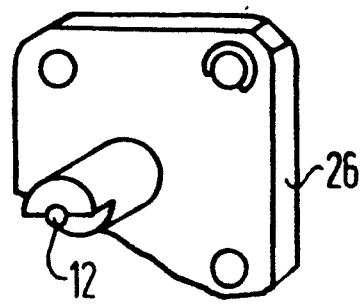

MEASURING MOUNT FOR MICROWAVE COMPONENTS

BACKGROUND OF THE INVENTION

1. Field of the Invention

This invention relates in general to a measuring mount for microwave components.

2. Description of Related Art

The measurement of microwave properties of microwave components requires an apparatus that allows precise measurements to be obtained even at high frequencies.

Particularly for measuring the series characteristics of microwave semiconductors requires apparatus which can precisely measure the microwave properties.

Apparatus for the precise measurement of the microwave properties is required because of the switch of microwave semiconductor housings to formats which are equipped with automatic units particularly SMD formats, for example, with shortened terminal bands or completely without terminal bands such as directly contactable microwave housings.

A measuring mount for measuring the microwave properties of microwave components having various housing formats must satisfy both the precision demands as well as the production demands.

Known measuring mounts in microstrip line technology have the disadvantage of parasitic effects which considerably influences the measuring precision. There are no known measuring mounts for evaluating microwave components which have shortened terminal bands.

Reference should be made to U.S. Pat. No. 4,707,656, U.S. Pat. No. 4,340,860, German Gebrauchsmuster No. 88 10 268.8 and the publication entitled "Proceedings of the Fifteenth European Microwave Conference" in Paris, Sept. 9-13, 1985 entitled "A Coaxial Test Fixture For Microwave Transistor Characterization".

SUMMARY OF THE INVENTION

It is an object of the present invention to provide a measuring mount which satisfies the high precision requirements for measuring microwave components equipped with automatic units.

It is a feature of the present invention to provide a measuring mount for microwave components which has a slide means for introducing the component which is to be measured into the measuring mount and to position and contact the component so that measurements can be made in the measuring mount.

The invention provides a miniature measuring mount in which the component is introduced, positioned and directly contacted to the inner conductor of plugs by way of a slide system. The quality of the electrical measurements of the mounting unit is almost exclusively determined by the quality of the plugs.

A measuring mount of the invention provides very precise electrical measurements, has low losses and the results can be easily reproduced. A measuring mount of the invention is user friendly, rugged and long lasting.

The measuring mount of the invention provides very precise measuring results.

A system of the invention is very easy to service and has very high contact reliability, long useful life, low maintenance and also has very high precision and the measured results can be reproduced at high accuracies even at frequencies above 20 GHz. A measuring mount of the invention makes it possible to obtain maximum phase deviation of less than 2° at a frequency of 18 GHz.

The measuring mount of the invention is very simple to construct and can be easily adapted to various housing formats.

For example, the measuring mount of the invention is suitable for a component housing type CEREC which is 100 mil. A measuring mount of the invention is also suitable for housing formats H-PAC 100, CEREC 70 and H-PAC 70.

The operation and the maintenance of the measuring mount of the invention are extremely simple. The component to be measured can be inserted into a recess formed in a slide and then introduced into the measuring mount. The positioning and contacting of the component mount automatically occurs. The mechanical overloading of the measuring mount is impossible.

The measuring mount with components to be measured can be operated, for example, by compressed air and using magazine technology. A plurality of components under measurement can be received into the slide means. A plurality of different slides which have different components to be measured can also be successively introduced into the measuring mount. The supplying of the measuring mount with components to be measured can be automatically controlled.

The measuring mount of the invention can be designed such that it is relatively insensitive to contamination of the contacts. For example, the measuring mount can be formed so as to provide self-cleaning when contaminates are removed from the measuring mount upon actuation of the slide.

Due to the extremely low losses of the measuring mount of the invention an extremely simplified measuring calibration procedure, for example, at 6 GHz can be accomplished. Measuring can be made with an error of less 0.1 dB regardless of the specific transistor batches. Such measuring mount has especially low losses in combination with slide screw tuners.

The measuring mount of the invention does not require that the noise source be converted for calibration of the measuring station. A time savings of about ten minutes results per transistor semiconductor wafer to be measured due to this improvement. In the prior art, setup work has been required for a transistor semiconductor wafer under measure and this is eliminated with the measuring mount of the invention. Also, the plug wear is considerably reduced with the invention.

With the measuring mount of the invention, it is also possible for semiconductor components such as transistors to have long terminal bands.

The measuring mount of the invention can advantageously be utilized for microwave tetrodes type CFY 20/21 which have cut terminal bands.

The measuring mount of the invention provides very accurate results and does not require correction of measuring errors such as De-embedding. Measuring errors in the measuring mount of the invention are very small and can be ignored.

The measuring mount of the invention allows mass production and allows precise measuring and high reproducible precision. The basic precision of the invention is one to two orders of magnitude better than measuring mounts of the prior art.

In the measuring mount of the invention, components which are to be measured can be contacted using plugs or lines.

A high contact reliability occurs with the measuring mount of the invention because dirt is consistently removed due to the actuation of the slide.

The measuring mount of the invention allows the use of different slides for different components which are to be measured.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 is a plan sectional view of the invention with the slide and component not in the measuring position;

FIG. 2 is a plan sectional view illustrating the slide and component in the measuring position;

FIG. 12 is a side view and FIG. 13 is an end view of the slide of the invention;

FIG. 14 is a plan view of the stop plate of the invention;

FIG. 15 illustrates the carriage and component holder;

FIG. 16 is an exploded view illustrating the component holder environment;

FIG. 17 is an end view illustrating the component holder and the carriage;

FIG. 18 illustrates the electrical plug for making contact with the components;

FIG. 19 illustrates a side view and FIG. 20 is a plan view of a modification of the plugs of the invention; and FIG. 21 is a partially cut-away perspective view of a contact plug.

DESCRIPTION OF THE PREFERRED EMBODIMENTS

Figure 3:
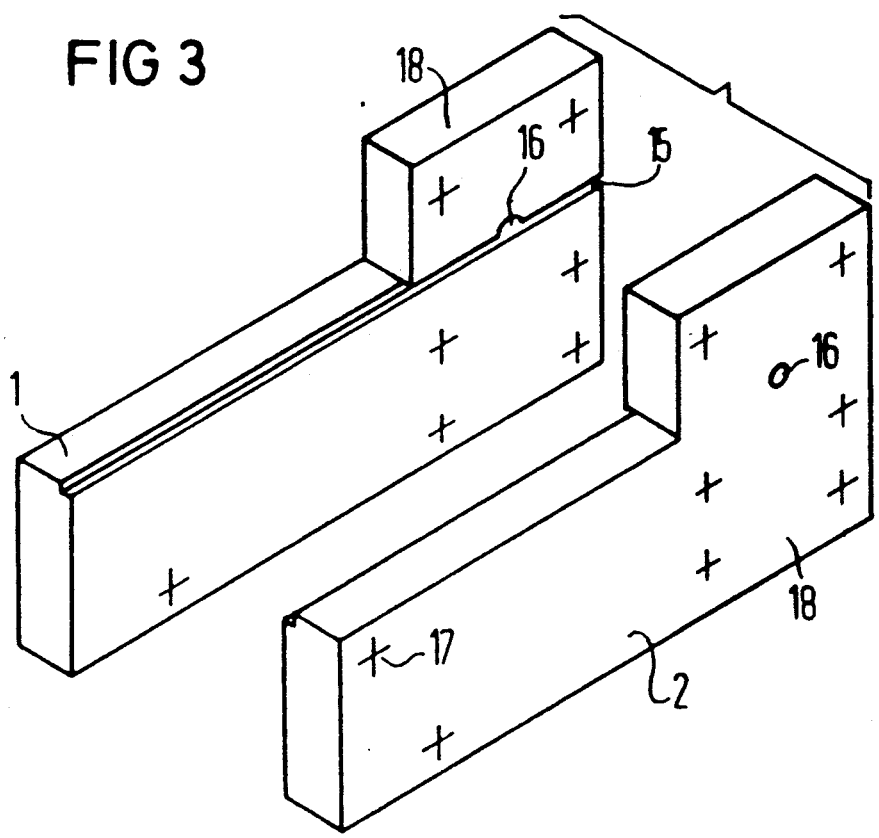
FIG. 3 is a perspective view of the side members of the invention.
Figure 6:
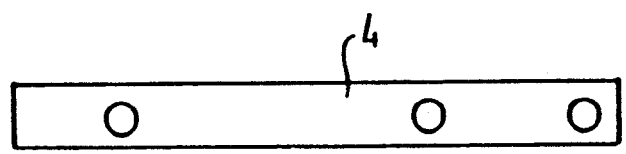
FIG. 6 is a side view and FIG. 7 is an end view of the rail of the invention.
Figure 7:

FIGS. 1 and 2 are partially cut-away side plan views of the measuring mount of the invention. The measuring mount utilizes a guide member for the slide means. Two side members 1 and 2 which are shown in FIG. 3 as well form the guide member. An electrical line (12, 13) extends from each side so as to contact the component being measured. The line 12 extends from the side member 1 and the line 13 extends from the side member 2 for example. The lines 12 and 13 can be formed as semirigid lines. The lines 12 and 13 can also be mounted inside conductors of two plugs 10 and 11 such as shown in FIGS. 18 and 19, for example, and which are rigidly connected to the measuring mount. A ground bar 3 is attached to the side members 1 and 2 as shown in detail in FIG. 4. A rail 4 which is shown in FIG. 6 is attached to the side member 1 as shown in FIG. 1 and the ground bar 3 and rail 4 are secured between the side members 1 and 2.

A slide means includes a carriage 6 which is shown in FIG. 15 as well as in FIGS. 1 and 2 and the carriage 6 can be shaped in the form of a wedge. The slide means comprises a slide 7 which is shown in FIG. 12 as well as FIGS. 1 and 2 and it can be moved back and forth in the guide member by the handle 9. Using the slide 7, the wedge carriage 6 can be moved in the same direction which the slide 7 moves as it is moved back and forth and the wedge carriage 6 can also be moved in a direction which is at right angles to the slide 7. The wedge carrier 6 is pressed against the ground bar 4 so as to make contact between a component 30 which is being measured in the measuring mount. The second direction of movement of the carriage 6 can be perpendicular to the direction of the direction of movement of the slide 7, but it also can be at an angle which differs from 9° from the direction of movement of the slide 7.

In an exemplary embodiment, the slide means may comprise a wedge slide means comprising the parts 5, 6, 7, 8 and 9 shown in the FIGS. The wedge slide system receives the component 30 which is to be measured in a receptacle 5 and places the component under measurement into the measurement mount and positions the component 30 relative to a detent 8 and makes contact between the component 30 due to movement of the wedge carriage 6 and with the assistance of the slide 7. The component makes contact by moving vertically against the inner conductors 12 and 13 of the plugs 10 and 11 and against ground bar 3. The component 30 under measurement is placed upside down in the receptacle 5 in a recess of the wedge carriage 6. A cushioning means 6.3 is mounted between the receptacle 5 and the wedge carriage 6. The elasticity of the cushion 6.3 in the vertical direction causes a reliable ground contact of the component under measurement. When the contact 30 under measurement is a microwave transistor, then the cushion 6.3 provides a reliable ground contact of the two source terminals by way of the receptacle 5 to the ground bar 3. The elasticity of the cushion 6.3 in the lateral direction, in other words, in a direction that lies in a plane of the direction of the movement of the slide 7 and in a direction perpendicular to the plane of the drawing provides a direct ground contact of the receptacle 5 to the two side members 1 and 2 such that parasitic resonance of the receptacle 5 and the other parts of the slide means are suppressed in a reliable manner.

The measured results which are achieved are improved when the cushion 6.3 is carefully manufactured and fitted. The cushion 6.3 can be formed such that it does not impede the motion of the carriage 6. A spring 6.1 between the slide 7 and the wedge carriage 6 additionally prevents an undesired biasing of the carriage 6 when the slide means is moved into the measuring mount so that full vertical freedom of motion of the carriage 6 is assured. This assures that after the slide 6 is released from the contact position of the component 30 under measurement in the measuring mount that the slide can again drop down away from the ground bar 3.

It is desirable to make the individual components of the measuring mounts as flat and planar as possible to improve the measured results. The individual parts of the measuring mount can be fitted in a manner referred to as a pull-off. The openings for the lines 12 and 13 in the side members 1 and 2 should not be made out of alignment during deburring.

The measuring mount should be assembled so that it is very accurately aligned.

So as to reliably contact the component 30 under measurement to the undersides of the electrical lines 12 and 13 and the ground bar 3 can be adjusted such that the terminal contacts of the component 30 being measured exert a certain pressure on the conductors 12 and 13 so that the electrical contacts of the component being measured will be somewhat spring biased.

The ground bar 3 can be adjusted in the following manner. First, the mechanical connections which join the two side members 1 and 2 are slightly released. The ground bar 3 should then be moved between the two side members 1 and 2. The ground bar 3 is then pressed downwardly. A component 30 under measurement is then inserted into the receptacle 5. The slide is then moved into the position so that the component 30 is in contact and ready for measurement. The ground bar 3 will move up away from the wedge slide 6. When a detectible pressure at which the component 30 under measure makes contact against the electrical conductors 12 and 13 exists, the mechanical connections which secure the side members 1 and 2 are then tightened. The contacts of the component 30 under measurement are then tested. The contacts of the component 30 under measurement will not be damaged when the ground bar is correctly adjusted. Finally, it must be checked to make sure that there is a reliable contact between the contacts 12 and 13 and the component This procedure completes the adjustments necessary for the measuring mount.

The ground bar 3 could also be adjusted using worm screws mounted in the measuring mount.

So as to reliably remove the component 30 under measurement from the measuring mount, the slide 7 has a detent 14 for releasing and removing the wedge carriage 6 from the contacting position.

In FIG. 1, the measuring mount is open so that the component 30 can be placed into the receptacle 5. In FIGS. 1 and 2, the front side member has been removed. In FIG. 2, the measuring mount has been closed so as to measure the component 30. The component 30 under measurement is moved into the measuring mount using the slide 7 with a force F1 applied to the handle 9 until the component 30 under measurement is positioned horizontally at which time the wedge 6 will be against the stop plate 8 and the component 30 being measured will be moved vertically so that it is in contact due to the upward direction of the carriage caused by the force F2 that the detent applies to the wedge and also to the force F3 which the slide 7 exerts on the wedge 6 from below due to the inclined surface of the slide 7. A contact to ground thus results due to the frictional connection between the receptacle 5 and the ground bar 3. The signal paths to the outside of the device are produced by the pressure of the component 30 under measurement against the conductors 12 and 13 and possibly by way of the flanges on the plugs 10 and 11. The exact setting of the contact position of the component 30 under measurement results on the basis of a vertical adjustment of the ground bar 3. The measuring mount remains in the contact position in a self-biased manner.

FIGS. 3–21 illustrate the specific components of the measuring mount of the invention. For example, FIG. 3 illustrates a two side members 1 and 2 which are formed with cut grooves 15 so that the motion of terminal bands of a component 30 under measurement inside the measuring mount will not be inhibited. All of the nonelastic parts of the measuring mount can be manufactured of brass having a thin gold plating which is 5 mm thick. The contact to ground is thus improved. The two side members 1 and 2 are secured to each other on their undersides using three screws and by the rail 4 shown in FIG. 6 which acts as a spacer. An opening 17 formed in the side members 1 and 2 allows the fastening of the side members 1 and 2 to each other and also serves to limit the path of the slide 7 in the direction away from the ground bar 3. The side members 1 and 2 are milled so as to have a thinner thickness in the regions 18 at one end where a provision is made to attach two flange plugs 10 and 11 from the outside. The inside surfaces of the side members 1 and 2 are formed so that they are planar and parallel to each other. The openings 16 shown in FIG. 3 serve to accept the inner conductors 12 and 13 of the plugs 10 and 11. The plugs 10 and 11 can be fastened to the side members 1 and 2 with four screws which extend from the outside surface.

Figure 4:
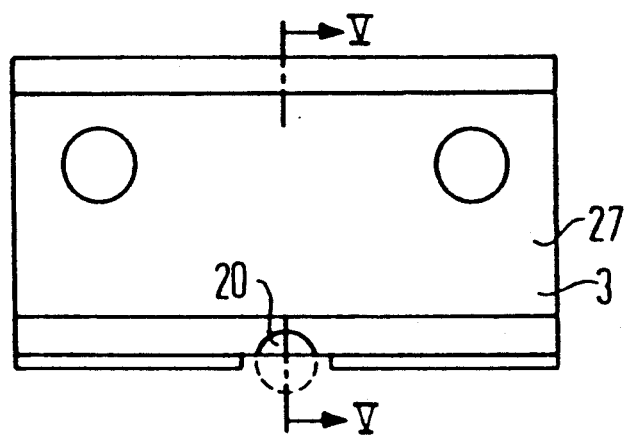
FIG. 4 is a side view and FIG. 5 is sectional view of V—V from FIG. 4 of the ground bar of the invention.
Figure 5:
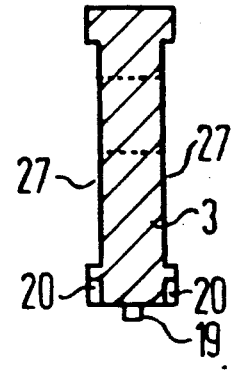

FIGS. 4 and 5 illustrate a ground bar 3. On the bottom edge of the ground bar which extends toward the component 30, the ground bar 3 has a ridge 19. This ridge contacts the component 30 under measurement and connects it to ground. Also, the ground bar 3 has a hemispherical milled portion 20 at the heights of the openings 16 in the side members 1 and 2 on both sides of the two side members 1 and 2 into which the ends of the lines 12 and 13 can project. The millings, grooves, ridges and the reduced thicknesses in the region 18 result in improved measured results of the component.

Figure 8:
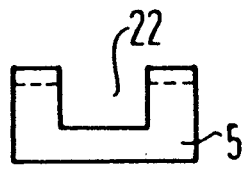
FIG. 8 is a side view and FIG. 9 is an end view of the component receiver.
Figure 9:
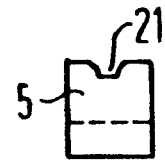

FIGS. 8 and 9 illustrate a receptacle 5. The receptacle 5 is formed with depressions 21 and 22. The depression 21 corresponds to the ridge 19 of the ground bar 3 which rides therein. The depression 23 corresponds to the bores 16 and to the milled portion 20. A receptacle 5 can also be formed so that it simultaneously accepts a plurality of components 30 under measurement. Within the framework of a slide means, the receptacle 5 can also be formed such that, for example, after a component 30 has been measured, the detent 8 moves toward the side until a new component 30 which is to be measured is brought into the contact position and successive components 30 one after the other can be successively measured by moving the slide means in only a single direction. A plurality of components can thus be simultaneously measured successively in groups. For example, a slide means for this purpose can always move in one direction through the measuring mount in a belt manner or band manner or in a circular fashion.

The receptacles or the slides 6 can be formed to have different shapes for different sizes of components 30. The dimensions of the ridge 19, the hemispherical opening 20, and the groove 21 can be selected to have different dimensions for the electrical contacts of the component 30. Components which have different dimensions can be received by using receptacles which differ in size for the components 30. Components having more than four terminals can also be measured.

Figure 10:
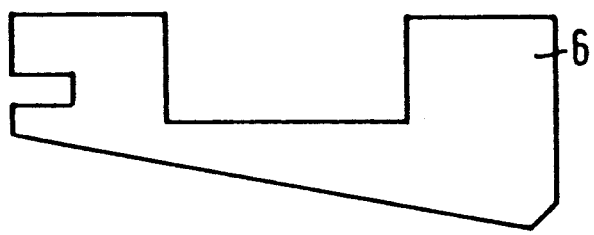
FIG. 10 is a side view and FIG. 11 is an end view of the slide carriage of the invention.
Figure 11:
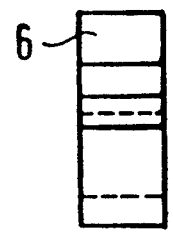

FIGS. 10 and 11 illustrate in side and end view the carriage 6.

FIGS. 12 and 13 illustrate, in side and end view the slide 7.

FIG. 14 illustrates in plan view a stop plate 8.

The cushion 6.3 allows a mechanical resilience of the receptacle 5 so as to assure the grounding pressure at the component 30 under measurement will be maintained. The cushion 6.3 can also serve the purpose for electrical connection to ground between the receptacle 5 and the two side members 1 and 2 when the measuring mount is closed so as to avoid parasitic resonances of the receptacle 5.

The cushion 6.3 is resilient in the vertical direction. With vertical pressure, the cushion 6.3 can have a lateral expansion for connection to ground to the side parts 1 and 2. The cushion 6.3 does not exert any lateral pressure when the vertical pressure is removed.

The cushion 6.3 can be formed of silicon rubber and can have the shape of a lamina. When using the cushion 6.3 as a grounding cushion, the silicon rubber band can be surrounded by hose which is formed of stranded conductors of copper. The cushion 6.3 can also be formed of a copper woven band which is multiply folded.

FIGS. 15, 16, and 17 illustrate an especially advantageous embodiment of the receptacle 5. The receptacle 5 has recesses 21 and 22 as shown in FIG. 8. The receptacle 5 also has a wedge-shaped under portion 23. A lamina 25 silicone rubber is inserted into the recess of the slide wedge 6 provided for receiving the component 30 under measurement. Six metal wedges 24 shown in FIGS. 16 and 17 are placed on the lamina 25 such that the wedge shaped under portion 23 of the receptacle 5 can be seated on the wedges 24. The wedges 24 are advantageously formed of metal. Three wedges can be arranged following each other in the longitudinal direction at the side of each and at every side portion 1 and 2. The wedges 24 are parallelpipeds which have a triangular cross-section. The receptacle 5 is also advantageously formed of metal. The metal wedges 24 are shaped such that contact between the receptacle and the wedges 24 occurs directly on the component 30 to be measured which is inserted into the receptacle 5. For this purpose, the metal wedges have arbitrary geometrical shapes which can be formed such that contact occurs directly under the component 30 being measured. For this purpose, the metal wedges 24 can have a more acute angle than the wedge-shaped under-portion 23 of the receptacle 5. For example, the wedges 24 can have an angle of 40° at the ends that points toward the component 30 under measurement. The occurrence of parasitic effects is practically impossible when the wedge-shaped under-portion 23 of the receptacle 5 has an angle of 45° at the end adjacent to the component 30 under measurement. The use of six wedges 24 suppresses undesired self-oscillation.

It is also possible to use only one wedge 24 at each side of the receptacle 5 in combination with spacers.

FIGS. 18, 19, 20, 21 illustrate the plugs 10 and 11. Plugs APC7PC7 from the Rosenberger Company, D-8-61 Tittmoning German may provide specially desirable plugs 10 and 11. The suitability of the measuring mount of the invention is essentially limited by the formation of a cavity wave in the plugs 10 and 11. When the plugs 10 and 11 are suitable for extremely high frequencies, then the measuring mount of the invention is also suitable for extremely high frequencies.

The inner contacts 12, 13 of the plugs 10 and 11 are formed such that they spring in the Teflon with a spring movement path of 0.1 mm. A certain eccentricity in the plugs 10 and 11 does not prevent accurate measurements. The spring path at an inner conductor 12 or 13 reduces the necessity of a precise adjustment of the measuring mount.

FIG. 18 shows the terminal side of a plug 10 or 11 of a commercially available type. For measuring with the invention, the pin 28 is first cut off. A semicircular segment 27 such as shown in FIGS. 19 and 20 is then cut-off from the dielectric sheath 29 which is arranged around the pin 28. FIG. 21 illustrates a flange 26 which is attached from the outside in the region 18 of the side members 1 and 2 whereby the inner conductor 12 of the plug 10 and 11 projects through the opening 16 into the interior of the measuring mount.

The component 30 under measurement is not damaged in a measuring mount of the invention regardless of the pressure F1 with which the measuring mount is closed and also regardless of the pressure F3 with which the component under measurement is pressed against the ground bar 3. The sliding of the slide means can be optimized by rhodanizing the ways of the slide.

The reference plane for the contacting position is always the ground bar in a measuring mount of the invention even for the plugs 10 and 11. An electrical terminal contact is therefor always pressed upward in the proper manner regardless of the thickness of, for example, a terminal band.

A measuring mount of the invention has a high useful life and is subject to practically no wear. The ground bar can advantageously have further milled portions 27 above the milled portion 20 and these further milled portions 27 can extend across the entire length of the ground bar 3 to the side members 1 and 2 on either side. These milled portions 27 assure that a good contact to ground between the ground bar 3 and the side members 1 and 2 exist at the underside of the ground bar 3 in the region close to the component 30 under measurement.

Despite the presence of two plugs, a through member, a contacting member and the other parts of the measuring mount, a maximum return loss of only 20 dB results in a measuring mount of the invention. This maximum reflection attenuation is only slightly greater than the maximum reflection attenuation of the two plugs flanged directly to each other. This means that the reflection attenuation in a measuring mount of the invention is influenced only by the quality of the plugs 10 and 11. This means that a measuring mount of the invention can obtain very good measuring results if the signal paths are proper.

A measuring mount of the invention has very good insulation of 50 dB which is very good.

The measuring mount can be equipped with a 50 ohm through member for checking for imperfections or irregularities. The quality of the measuring mount is limited only by the quality of the plugs 10 and 11. When a measuring mount of the invention is equipped with a 50 ohm through-member then the following values result for the measuring mount; input/output reflection with through piece S11, S22 less than $-14$ dB. This correspondence to an input/output reflection of less than 20 dB per side. The sum of the transit reflection and transit losses S21 is less than 0.4 dB. The isolation S12, in other words, the overcoupling between the input and the output is less than $-60$ dB. This means that the isolation is better than the resolution of the measuring system.

Although the invention has been described with respect to preferred embodiments, it is not to be so limited as changes and modifications can be made which are within the full intended scope of the invention as defined by the appended claims.

I claim as my invention:

1. A measuring mount for microwave components, comprising a base structure, a slide means (6-9) on which a component (30) which is to be measured is mounted and can be moved longitudinally relative to said base structure into the measuring mount so as to position and make contact between said component and (30) a measuring contact (12), comprising a recess formed in a tapered slide part (6) of said slide means so as to allow the component (30) being measured to be inserted into said measuring contact wherein said base structure includes two side members (1, 2) which are guide members for the slide part (6), wherein said slide means comprises a first portion formed with an inclined plane and said slide part moveably mounted on the inclined plane of said first portion, wherein said slide part (6) is mounted to move on said inclined plane relative to said slide means, including a stop on said base structure which engages said slide part (6) for positioning said component (30) being measured and wherein said component being measured makes contact with said slide part (6), and including an elastic cushion (6.3) mounted in said slide means so as to elastically cushion the component (30) being measured and wherein said slide means and said slide part initially move together longitudinally on said base structure until said slide part (6) engages said stop after which said slide part (6) moves upwardly as said slide means continues to move longitudinally relative to said base structure.

2. A measuring mount according to claim 1, wherein said base structure includes a ground bar (3).

3. A measuring mount according to claim 2 including means for adjusting said ground bar (3).

* * * * *